(12) United States Patent
Woyzichovski

(10) Patent No.: US 8,311,131 B2
(45) Date of Patent: Nov. 13, 2012

(54) METHOD FOR INTERPOLATING AT LEAST TWO POSITION-DEPENDENT, PERIODIC ANALOG SIGNALS THAT ARE DEPHASED RELATIVE EACH OTHER

(75) Inventor: Roman Woyzichovski, Kunitz (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 2395 days.

(21) Appl. No.: 10/501,310

(22) PCT Filed: Dec. 4, 2002

(86) PCT No.: PCT/EP02/13702
§ 371 (c)(1),
(2), (4) Date: Nov. 23, 2004

(87) PCT Pub. No.: WO03/058820
PCT Pub. Date: Jul. 17, 2003

(65) Prior Publication Data
US 2005/0068206 A1  Mar. 31, 2005

(30) Foreign Application Priority Data

Jan. 11, 2002 (DE) ................... 102 01 249
Feb. 27, 2002 (DE) ................... 102 08 915

(51) Int. Cl.
*H04B 14/06* (2006.01)
*H04L 23/00* (2006.01)
*H03M 3/02* (2006.01)

(52) U.S. Cl. .................. 375/247; 375/377; 341/143

(58) Field of Classification Search .................. 375/226, 375/242, 244, 247, 248, 249, 377; 324/600, 324/601, 622; 341/126, 155, 143; 708/290
See application file for complete search history.

(56) References Cited

U.S. PATENT DOCUMENTS

| 4,225,931 | A | * | 9/1980 | Schwefel | ...... 702/150 |
|---|---|---|---|---|---|
| 4,462,083 | A | * | 7/1984 | Schwefel | ...... 702/94 |
| 4,987,414 | A | * | 1/1991 | Iijima et al. | ...... 341/15 |
| 5,079,549 | A | * | 1/1992 | Liessner | ...... 341/116 |
| 5,134,578 | A | * | 7/1992 | Garverick et al. | ...... 708/605 |
| 5,142,226 | A |   | 8/1992 | Sakamoto et al. | |

(Continued)

FOREIGN PATENT DOCUMENTS

DE   195 02 276   8/1996

(Continued)

*Primary Examiner* — Tesfaldet Bocure
(74) *Attorney, Agent, or Firm* — Kenyon & Kenyon LLP

(57) ABSTRACT

The present invention relates to a method for interpolating, for the purpose of measurement of lengths and/or angles, at least two position-dependent, periodic analog signals that are phase-shifted with respect to each other and that are generated by scanning a measuring scale. According to the inventive method, the analog signals are converted to a digital data stream using a sigma-delta modulator, the data streams are combined with correctional factors and then with each other to generate a string of results, and said string of results is used to generate new correctional values by the use of a quality criterion to be satisfied for interpolation and also to generate the output signals of interpolation. The values (d) of the string of results are accumulated over a specified time interval in order to generate the correctional values (k1, k2) and the output signals (w). The signal sequence generated by accumulation is used directly as the address sequence for generating the correctional values (k1, k2) and the output signal (b).

22 Claims, 1 Drawing Sheet

U.S. PATENT DOCUMENTS

| | | | | |
|---|---|---|---|---|
| 5,220,275 | A | 6/1993 | Holmqvist | |
| 5,485,152 | A | 1/1996 | Wilson et al. | |
| 5,485,407 | A | 1/1996 | Ishimoto et al. | |
| 5,625,310 | A | 4/1997 | Takeishi | |
| 5,644,514 | A | 7/1997 | Abo et al. | |
| 5,677,686 | A | 10/1997 | Aoki et al. | |
| 5,706,219 | A | 1/1998 | Ishimoto | |
| 5,734,688 | A | 3/1998 | Teraguchi et al. | |
| 5,783,925 | A | 7/1998 | Umemura et al. | |
| 5,786,781 | A * | 7/1998 | Taniguchi et al. | 341/111 |
| 5,920,494 | A | 7/1999 | Setbacken et al. | |
| 5,943,639 | A * | 8/1999 | Tanaka et al. | 702/163 |
| 5,963,160 | A | 10/1999 | Wilson et al. | |
| 5,999,113 | A | 12/1999 | Kiriyama et al. | |
| 6,041,336 | A * | 3/2000 | Steinlechner | 708/4 |
| 6,188,341 | B1 | 2/2001 | Taniguchi et al. | |
| 6,278,388 | B1 * | 8/2001 | Kushihara | 341/112 |
| 6,534,969 | B1 | 3/2003 | Dietmayer | |
| 6,608,573 | B2 * | 8/2003 | Kushihara | 341/116 |
| 2002/0116181 | A1 * | 8/2002 | Khan et al. | 704/205 |

FOREIGN PATENT DOCUMENTS

| | | |
|---|---|---|
| DE | 195 06 276 | 9/1996 |
| DE | 197 04 132 | 8/1997 |
| DE | 198 22 843 | 11/1999 |
| DE | 199 11 822 | 8/2000 |
| DE | 199 34 478 | 2/2001 |
| DE | 199 38 802 | 2/2001 |
| DE | 196 05 472 | 3/2001 |
| DE | 100 25 160 | 12/2001 |
| DE | 195 44 948 | 9/2002 |
| EP | 0 484 576 | 5/1992 |
| EP | 0 599 175 | 6/1994 |
| EP | 0 669 517 | 8/1995 |
| EP | 0 874 223 | 10/1998 |
| EP | 0 875 735 | 11/1998 |
| EP | 0 997 701 | 5/2000 |
| EP | 0 724 137 | 7/2001 |
| EP | 0 711 974 | 9/2001 |

* cited by examiner

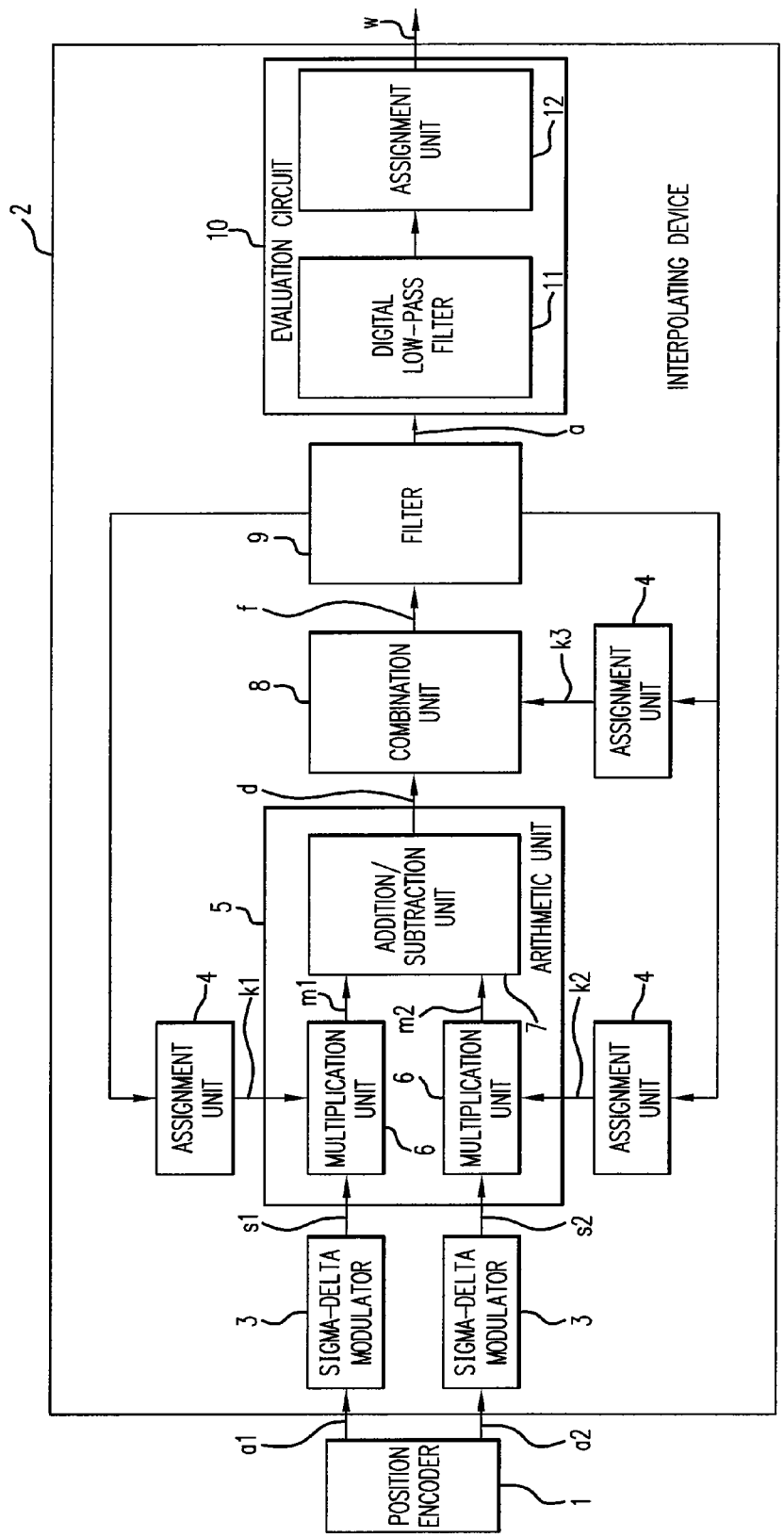

METHOD FOR INTERPOLATING AT LEAST TWO POSITION-DEPENDENT, PERIODIC ANALOG SIGNALS THAT ARE DEPHASED RELATIVE EACH OTHER

FIELD OF THE INVENTION

The present invention relates to a method for interpolating at least two position-dependent, periodic analog signals that are phase-shifted with respect to one another.

BACKGROUND INFORMATION

Such a method is used to interpolate analog signals generated by scanning a measuring graduation, for position-measuring, i.e., especially for measurement of lengths and/or angles. In this connection, the analog signals are respectively converted into a digital data stream, with the aid of a sigma-delta modulator. For generating a (single) string of results, the at least two data streams are then first combined with correctional factors and subsequently with one another. From the string of results, on the one hand, new correctional values are generated in the light of the quality criterion to be satisfied (by the values of the string of results), and on the other hand, the output signals of the interpolation are generated.

The at least two analog signals are particularly phase-shifted by 90° to one another, and are essentially sinusoidal, the latter also including analog signals generated from the sine function by phase-shifting, such as cosine signals.

Such a method is described in German Published Patent Application No. 199 38 802. In this method, the string of results is supplied to a digital filter, which restores certain data of the input signals, and which subsequently increments or decrements a phase counter as a function of the output value of the filter. The phase value generated hereby is used on the one hand (up to the fulfillment of the quality criterion) for determining new correctional values, and on the other hand for determining the output signal of the interpolation. For the satisfaction of the quality criterion, the string of results generates a signal sequence or string in a filter, at simultaneous decimation, which, after comparison to the quality criterion, controls the correctional values such that the string of results approaches this quality criterion, and in addition, a string of addresses is formed from which, after low-pass filtering and association, the output signals are generated.

German Published Patent Application No. 195 02 276 describes an interpolation method for interpolating at least two sine-like analog signals, for measuring paths and/or angles, that are obtained by the scanning of a graduation carrier, are position-dependent, periodic and phase-shifted by 90° to one another, in which noise is superimposed on the analog signals in each case using sigma-delta modulation, in which, from the thus generated data strings, upon simultaneous first incomplete low-pass filtering of the noise components above the maximum input frequency of the analog signals, sequences of signals are generated, and in which, from the sequences of signals, a sequence of angular values is obtained to which is assigned, after a second low-pass filtering of the still-present noise component, above the maximum input frequency of the analog signals, a string of output values.

German Published Patent Application No. 195 06 276 describes a method for interpolating sensor signals, in which respectively one sine signal and one cosine signal of a sensor is supplied to a bridge circuit having several tapping points and a value comparison is carried out between a tapping pair, made up of two tapping points which are diametrically opposite in the bridge circuit. If a value equality between the tapping pair is determined which corresponds to a zero crossing of the scanning value, a signal representing the setting of the corresponding tapping pair is emitted. In this context, the tapping pairs are scanned one after another in one direction, are subjected, one after another, to the value comparison, and a count value is assigned to each scanning event. Appropriate to the result of the comparison, a phase counter is incremented or decremented.

SUMMARY

According to an example embodiment of the present invention, the values of the string of results for generating the correctional values as well as the output signals are accumulated over a specifiable time interval, and the signal sequence generated by the accumulation is used directly as address sequence for generating the correctional values and the output signals.

Thus, according to an example embodiment of the present invention, to form an address sequence, a phase counter is not simply incremented or decremented, but rather, by accumulation, a phase value having a fractional proportion is generated. Thereby may be achieved a more exact phase correction, a lower gain of the loop used to satisfy the quality criterion, and consequently improved dynamics of the overall system. In the accumulation over a specified time interval (decimation of the data stream) the time interval may be selected such that, from the accumulated values of the string of results, the phase of the analog signals may specifically be determined.

The accumulation of the values of the string of results may take place in a filter, and, e.g., in a filter in the form of an integrator.

The address values of the address sequence formed by the accumulation represent in each case the phase information of the input-side analog signals, and are linearly dependent on the phase of at least one periodic analog signal, when the quality criterion is satisfied. That means, that if the generation of the output signals has advanced so far that the string of results or the address sequence generated therefrom approach a predefined quality criterion, there is then a linear association between the address values and the phase of the input-side analog signals.

From the address sequence, the output signals of the interpolation are able to be generated by low-pass filtering and subsequent assignment of the address values.

According to an example embodiment of the present invention, the address values of the address sequence represent a phase value having a fractional component, for the generation of the correctional value the high-value part of the address sequence being used, which corresponds to an incremental component of the address sequence, and, for the generation of the output signals of the interpolation, the high-value and the low-value part of the address sequence being used. The latter corresponds to the fractional part or proportion of the address sequence.

The higher-value part of the address sequence is defined such that the address depth of the correctional values assures the desired interpolation. If, for example, the period of a sine type of input-side signal is to be subdivided 32-fold for the desired interpolation, the higher-valued part of the address sequence should have a width of 5 bits. The remaining, low-valued part of the address sequence determines the fractional component of a phase increment.

All in all, the determination of the output signals of the interpolation takes place recursively, using a closed loop, in that, in the light of the quality criterion, new correctional values are generated and combined with the digital data streams generated from the input-side analog signals, as long as the quality criterion is satisfied.

The possible correctional values, in which particularly values of trigonometric functions (sine functions and/or cosine functions) may be involved, may be stored as predetermined values in an assignment unit. From the values stored in the assignment unit, the correctional values to be combined respectively with the individual data of the digital data streams are selected in the light of the quality criterion, as a function of the current address values of the address sequence. In this context, the quality criterion may optionally be applied directly to the values of the string of results, in that, a corresponding combining unit is preconnected to the filter (integrator) that is used for generating the address sequence, or this combining unit is combined with the filter (integrator) to form one unit.

For the generation of the string of results, the individual data of the digital data streams generated from the input-side analog signals are in each case combined multiplicatively with a correctional factor, and subsequently the data of different data streams are combined with one another by addition or subtraction.

The sigma-delta modulator may be designed such that the individual data of the digital data streams, generated thereby, in each case have a word width of only one bit.

In the case of an exact phase position and a sinusoidal pattern of the input-side analog signals, the values d of the string of results are formed according to the formula $d=s1*k1+/-s2*k2$, where $s1$, $s2$ are data of the digital data streams generated using the sigma-delta modulation, and $k1$, $k2$ are assigned correctional factors. In this context, the address sequence generated by accumulation of the values d of the string of results influences the correctional values such that a linear association with the angular information of the input-side analog signals is produced.

If, in the data of the data streams generated by the sigma-delta modulation, data having a word width of one bit are involved, then the multiplication $s1*k1$ and $s2*k2$ yields the values $k1$ at $s1=1$, and $-k1$ at $s1=0$, and $k2$ at $s2=1$ and $-k2$ at $s2=0$. At sufficient word width of the correctional values $k1$, $k2$, the complement may occur in a simplified manner by the complement on one.

Since, in the case of a word width of one bit, for the data of the digital data streams as the result of the above-explained combination for generating the values d of the string of results, exactly four cases may be distinguished, the combination (arithmetic operation) $s1*k1+/-s2*k2$ may be combined. The four cases may be represented arithmetically as the sum $k1+k2$ of the correctional values, the difference $k1-k2$ of the correctional values, as well as their negatives. If these differences and sums are stored as correctional values, the expenditure or effort for the arithmetic operations is reduced even more.

A digital interpolation device for carrying out the method is also described herein.

According to an example embodiment of the present invention, a method for interpolating at least two position-dependent, periodic analog signals that are phase-shifted with respect to one another and which are generated by scanning a measuring scale includes: converting each of the analog signals into a digital data stream by a sigma-delta modulator; generating a string of results by combining the data streams with correctional factors and subsequently combining the data streams with one another; generating from the string of results (a) new correctional values in accordance with a quality criterion that is to be satisfied during interpolation and (b) output signals of the interpolation; accumulating over a specifiable time interval values of the string of results for generating the correctional values and the output signals; and using a signal sequence generated by the accumulation as an address sequence for generating the correctional values and for generating the output signal.

According to an example embodiment of the present invention, a device for interpolating at least two position-dependent, periodic analog signals that are phase-shifted with respect to each other and which are generated by scanning a measuring scale includes: a sigma-delta modulator configured to convert the analog signals to a respective digital data stream; an arithmetic unit configured to generate a string of results in accordance with a combination of the data streams with correctional factors and in accordance with subsequent combination of the data streams with one another; an arrangement configured to generate, from the string of results, (a) new correctional values in accordance with a quality criterion that is to be satisfied during the interpolation and (b) output signals of the interpolation; a filter configured to accumulate values of the string of results over a specified time interval to generate an address sequence to control the arithmetic unit to guide the string of results to satisfy the quality criterion; and an evaluation circuit post-connected to the filter configured to convert address values of the address sequence into output values of the interpolation.

Other features and aspects of the present invention are set forth in the following description of exemplary embodiments with reference to the appended Figure.

BRIEF DESCRIPTION OF THE DRAWING

FIG. 1 is a schematic view of an interpolation device and the appertaining interpolation method for application in the case of position encoders to the measuring of paths and/or angles, by a block diagram.

DETAILED DESCRIPTION

The starting point of the block diagram shown in FIG. 1 is at least two analog signals a1 and a2 that are similar to sines, phase-shifted by 90° with respect to one another, periodic, position-dependent, and obtained by scanning in a position encoder 1 of a measuring system, which are to be used for measuring paths and/or angles. They are in each case converted using sigma-delta modulation in a sigma-delta modulator 3 into digital data streams s1, s2 (word sequences) of high frequency and low word width, in which amplitude information is contained in the distribution over time of the data. The two data streams s1, s2 having m bit-wide data are accordingly created from analog signals a1 and a2 in each case by superimposition of a noise signal. This noise signal results from the quantization noise of the sigma-delta modulation.

The data of the digital data streams s1, s2 are multiplied in a multiplication unit 6 of an arithmetic unit 5 respectively by correctional values k1, k2 from an assignment unit 4, in which a specifiable number of possible correctional values is stored. From the two new strings m1, m2, formed by multiplication of the data by the correctional values k1, k2, a single string of results d is formed by addition or subtraction of the words of those strings m1, m2 in an addition/subtraction unit 7 of arithmetic unit 5.

After the combination, in combination unit 8, with a quality criterion k3, supplied from assignment unit, the values of string of results d are supplied to a filter in the form of an integrating unit 9, in which it is accumulated for the formation of an address sequence a over a specifiable time period. A part (e.g., the higher-value part) of the value accumulated in integration unit 9 is combined with a value from assignment unit 4, and the combination result is used directly for addressing for the selection of new correctional values k1, k2 from assignment unit 4 for multiplication by data of the sigma-delta modulation. Alternatively, combination unit 8 may also be positioned behind filter 9, the addressing of the correctional values in assignment unit 4 then taking place of a part of the output value of post-connected unit 8.

In case the quality criterion is not equal to zero, that is, the input-side analog signals are not sinusoidal or cosinusoidal, quality criterion k3 is ascertained in an appropriate manner, as was described above in the light of correctional values k1, k2.

In the adjusted state, the addresses of the address sequence a oscillate between discrete values which represent the best approach to the exact phase setpoint value of the input signals. Output signal w of the interpolation is formed by closing additional filtering and assignment in an evaluation circuit 10, which includes a digital low-pass filter 11 and an assignment unit 12.

The output of output signal w takes place as a function of the assignment unit in the form of two square-wave signals that are phase-shifted with respect to each other by 90°, or it takes place in any other desired form (binary, Gray code, etc.).

Similar to the case of network interpolators, the phase information is obtained during the conversion, and it includes a linear association between the change of the angular value of input-side analog signal a1 or a2 and the change of output value w.

A digital interpolation device is used for the implementation of the above-described method.

Input signals of the interpolation device form two analog signals a1 and a2, that are similar to sines and are phase-shifted with respect to each other by 90°, for instance, coming from incremental position encoders that may be conventional. In the interpolation device according to an example embodiment of the present invention, from the two analog signals a1 and a2, the output value w is obtained having the resolution resulting from the demanded degree of interpolation.

First, the two analog signals a1 and a2 are each supplied to a sigma-delta modulator 3. The output signals of sigma-delta modulators 3, two digital data streams s1, s2 having data of low width (e.g., words of 1-bit width) are multiplied in multiplication unit 6 of arithmetic unit 5 by one correctional value k1, k2, respectively, of assignment unit 4, and, after addition or subtraction of the sequences to/from each other in addition/subtraction unit 7 of arithmetic unit 5, the values of string of results d are supplied to integrator 9, whose output signal is an address sequence a composed of address values.

One part of address sequence a is additionally combined with a value from assignment unit 4. The result of the combination determines the selection of correctional values from assignment unit 4 such that a quality criterion k3 is achieved.

The address values of address sequence a represent the phase information sought, acted upon by low residual noise. Subsequent filtering of the address values and the assignment forms interpolated output w.

The possible correctional values k1, k2, which are selected as a function of the current address value, may be stored in assignment unit 4, for example, in the form of a table. If, for instance, in the case of possible correctional values k1, k2, values each of a trigonometric function are involved, this means that, for a certain number of points (e.g., for 16 points), from the value range of the corresponding trigonometric function (e.g., a sine or a cosine function), the respective appertaining functional value is stored from the value range of the trigonometric function as a possible correctional value in the table mentioned above.

Here is a concrete example of this: If the possible values of the one correctional value k1 are determined to be functional values of a cosine function, then, accordingly, for 16 points out of the definition range (0° to 360°) of the cosine function of the respective appertaining functional value (e.g., the functional value cos θ0°=1 for the value 0° of the definition range, the functional value cos 22.5° for the value 22.50 of the definition range, the functional value cos 45° for the value 45° of the definition range, etc.) is stored as the possible value of correctional value k1 in the table provided for it. From these 16 functional values stored in the table, the respective correctional value k1 is then selected. The other correctional value k2 may be represented in corresponding fashion, such as by functional values of a sine function.

The width of the correctional values may be selected such that at least the number of different functional values may be represented, i.e., for 16 different functional values from which a correctional value is selected, its width is at least 4 bits. For 32 different functional values, the width of the correctional value would be at least 5 bits, etc. The width of correctional values k1, k2, in turn, determines (especially if the word width of the data of the two digital data streams s1, s2, that are to be combined with them, amounts to only 1 bit) the width of the values of string of results d, and thus also the address values of address sequence a.

Arithmetic unit 5 may, for example, be implemented as follows:

Arithmetic unit 5 includes two multiplication devices 6, such that, by multiplication, two strings m1=s1*k1 and m2=s2*k2 are formed from digital data streams s1, s2 and correctional values k1, k2 of assignment unit 4, the multiplication by correctional values k1, k2 being made in each case for the individual data of data streams s1, s2. Subsequently, in addition/subtraction unit 7 the difference m1−m2 of the two product strings m1, m2 is continuously formed.

At a bit width m=1 of the individual data of digital data streams s1, s2, the multiplication in multiplication device 6 consists in leaving the value of assignment unit 4 uninfluenced if s1='1' or s2='1', and in negating if s1='0' or s2='0'.

At bit width m=1 of the individual data of digital data streams s1, s2, there are yielded at the two outputs of sigma-delta modulators 3, taken as words, only four different states which, including the addition and subtraction, determine the sums and differences of the values of assignment unit 4 and their negation. When these values are stored in assignment unit 4, this may simplify the addition and subtraction unit and assignment unit 4.

Integrator 9 is an accumulator in the simplest case. Combination unit 8 is not needed when there is an exactly sinusoidal pattern to input-side analog signals a1, a2 and a phase position of the analog signals of 90° to each other, since the quality criterion becomes k3=0 (phase offset). In the case of other signal curves, the values of string d should be combined with quality criterion k3 from assignment unit 4 (addition/subtraction). Integrator 9 directly addresses assignment unit 4 (e.g., ROM) and after final filtering 11 and assignment 12 represents the output signal of interpolating device 2.

In the following, the effect of interpolating device 2 is described in greater detail. Interpolating device 2 evaluates the two sine-like analog signals a1 and a2 (sine or cosine signal) supplied by position encoder 1 and phase-shifted by 90° with respect to each other, such that output signal w of interpolating device 2 represents the path change detected by position encoder 1. Analog signals a1 and a2 supplied by position encoder 1 are changed in the appertaining sigma-delta modulators 3 into two m-bit-wide word strings s1, s2 (digital data streams) of high frequency and low word width of the data. The amplitude information of analog signals a1 and a2 are included in the distribution over time of the data of the two digital data streams s1, s2, at the output of these sigma-delta modulators. Multiplication unit 6, that is subsequent to each of the two data streams s1, s2, forms the new strings m1 and m2 from modulator strings s1, s2 and correctional values k1 and k2 from assignment unit 4. From these strings m1, m2 string of results d is generated in addition and subtraction unit 7, and combined with a quality criterion obtained from assignment unit 4 is supplied to integrator 9.

If there is an exactly sinusoidal curve of input signals a1 and a2, the integrator restores the information $\beta=\alpha$ according to $\sin(\alpha)*\cos(\beta)-\cos(\alpha)*\sin(\beta)=\sin(\alpha-\beta)$, where $\sin(\alpha)$ and $\cos(\alpha c)$ represent input-side analog signals a1, a2, and $\cos(\alpha)$ or $\sin(\beta)$ represent the correctional values k1 and k2 of assignment unit 4, and $\sin(\alpha-\beta)$ is proportional to the phase increment per scanning.

Other conversion functions may be selected for other kinds of input signals, for example, for correcting errors of the position encoder. In the case of sinusoidal input signals a1, a2, $\sin(\alpha-\beta)$ is minimized so as to achieve the quality criterion. In other words, the quality criterion is satisfied for $\alpha=\beta$. If $\beta$ is the counter value (address value of assignment unit 4), then, if $\sin(\alpha-\beta)=0$, $\beta$ becomes equal to $\alpha$ and $\beta$ thus corresponds to the phase position of the input signals.

To summarize, creating a digital interpolation for increasing the resolution of, e.g., incremental measurement of lengths and/or angles, may be realized in that, for one, the sigma-delta modulation may be utilized in converting analog input signals into digital data streams. The method of the sigma-delta A/D conversion may be chosen because the proportion of analog circuit components may be reduced and a high resolution may be achievable in the digital part. By utilizing the low-bit output signals of the sigma-delta modulators as input information for an arithmetic unit, arithmetical operations such as multiplication may be greatly simplified. The formation of only one criterion to be evaluated further may simplify the digital evaluation circuit (digital filter) and thereby also the circuit integration.

The properties of the method make it possible to integrate the non-linear A/D conversion largely into the digital part of the circuit, so that the interpolating device may be developed as an integrated circuit. The errors created by other methods, on account of non-ideally analogous component parts, may be largely avoided.

Going into details, an interpolating method and an interpolating device are provided, for signal subdivision (interpolation) of two analog signals (optionally voltage or current) that are sinusoidal and phase-shifted by 90° with respect to each other, e.g., from incremental position encoders for measurement of lengths and/or angles, in which the analog signals are in each case converted using sigma-delta modulation into a data stream of low bit width, in which each item of data from the data stream thus created is multiplied by values from an assignment unit in the case of which the product values of one sequence is added to or subtracted from the product values of the other sequence, and the string of results thus generated is accumulated, and a part of the accumulation value controls an address unit such that this address unit, on the one hand, addresses the assignment unit and, on the other hand, the output signals are formed via an assignment unit.

An aspect of the method described above and the appertaining interpolating device is that method steps using correction and having "sigma-delta A/D conversion" are combined, and, in this context, one may do without a costly network, and also, the conversion of the input data into position values is carried out in one step, using the digital conversion with the aid of the sigma-delta modulation. By combination of the principle of correction to the simple sigma-delta A/D conversion, the analog part of the interpolating device may be reduced to a minimum and its digital part may be simplified. It is possible to construct the entire interpolating device as an integrated circuit, using easily available technologies.

What is claimed is:

1. A method for interpolating at least two position-dependent, periodic analog signals that are phase-shifted with respect to one another and which are generated by scanning a measuring scale, comprising:
    converting each of the analog signals into a digital data stream by a sigma-delta modulator;
    generating a string of results by combining the data streams with correctional values and subsequently combining the data streams with one another;
    generating from the string of results (a) new correctional values in accordance with a quality criterion that is to be satisfied during interpolation and (b) output signals of the interpolation;
    accumulating over a specifiable time interval values of the string of results for generating the correctional values and the output signals; and
    using a signal sequence generated by the accumulation as an address sequence for generating the correctional values and for generating the output signal.

2. The method according to claim 1, wherein the values of the string of results are accumulated in the accumulating step in a filter.

3. The method according to claim 2, wherein the filter includes an integrator.

4. The method according to claim 1, further comprising forming the address sequence by the accumulation, the address sequence including address values that represent phase information of the analog signals.

5. The method according to claim 4, wherein the output signals are generated in the output signal generating step from the address sequence by low-pass filtering and assignment of the address values.

6. The method according to claim 4, wherein the address values are a linear function of the phase of the periodic analog signals when the quality criterion is satisfied.

7. The method according to claim 1, where address values of the address sequence represent a phase value having a fractional proportion.

8. The method according to claim 7, wherein the correctional values are generated in the correctional value generating step in accordance with a high-value part of the address sequence, the high-value part corresponding to an integer proportion of the address values.

9. The method according to claim 7, wherein the output signals are generated in the output signal generating step in accordance with a most-significant part and a least-significant part of the address sequence, the least-significant part corresponding to a fractional proportion of the address values, the most-significant part corresponding to an integer proportion of the address values.

10. The method according to claim 1, wherein the output signals are generated recursively in the output signal generating step by generating new correctional values in accordance with the quality criterion and combining the new correctional values with the data streams until the quality criterion is satisfied.

11. The method according to claim 1, further comprising storing possible correction values as predefined values in an assignment unit.

12. The method according to claim 11, further comprising selecting the correction values to be combined with the data of the data streams in accordance with the quality criterion as a function of address values of the address sequence.

13. The method according to claim 1, wherein the correctional values correspond to values of a trigonometric function.

14. The method according to claim 1, wherein the analog signals are phase-shifted by 90° with respect to each other.

15. The method according to claim 1, wherein the analog signals are substantially sinusoidal.

16. The method according to claim 1, wherein the combining step includes multiplicatively combining individual data of the digital data streams with a respective correctional value and subsequently combining data of different data streams with one another by one of (a) addition and (b) subtraction.

17. The method according to claim 1, wherein individual data of the digital data streams each have a word width of one bit.

18. The method according to claim 16, wherein the combining step includes reducing the combination of two data of the digital data streams with the correctional values and with each other to one of (a) an additive and (b) a subtractive combination of two correctional values.

19. The method according to claim 18, wherein the combining step includes combining the combination to one of four possibilities of the combination of the correctional values by one of (a) addition and (b) subtraction.

20. A device for interpolating at least two position-dependent, periodic analog signals that are phase-shifted with respect to each other and which are generated by scanning a measuring scale, comprising:
   a sigma-delta modulator configured to convert the analog signals to a respective digital data stream;
   an arithmetic unit configured to generate a string of results in accordance with a combination of the data streams with correctional values and in accordance with subsequent combination of the data streams with one another;
   an arrangement configured to generate, from the string of results, (a) new correctional values in accordance with a quality criterion that is to be satisfied during the interpolation and (b) output signals of the interpolation;
   a filter configured to accumulate values of the string of results over a specified time interval to generate an address sequence to control the arithmetic unit to guide the string of results to satisfy the quality criterion; and
   an evaluation circuit post-connected to the filter configured to convert address values of the address sequence into output values of the interpolation.

21. A method for interpolating at least two position-dependent, periodic analog signals that are phase-shifted with respect to one another and which are generated by scanning a measuring scale, comprising:
   converting each of the analog signals into a digital data stream by a sigma-delta modulator;
   generating a string of results by combining the data streams with correctional values and subsequently combining the data streams with one another;
   generating from the string of results a combination output in accordance with a quality criterion that is to be satisfied during interpolation;
   accumulating over a specifiable time interval values of the combination output for generating the correctional values and output signals; and
   using a signal sequence generated by the accumulation as an address sequence for generating the correctional values and for generating the output signal.

22. A device for interpolating at least two position-dependent, periodic analog signals that are phase-shifted with respect to each other and which are generated by scanning a measuring scale, comprising:
   a sigma-delta modulator configured to convert the analog signals to a respective digital data stream;
   an arithmetic unit configured to generate a string of results in accordance with a combination of the data streams with correctional values and subsequent combination of the data streams with one another;
   an arrangement configured to generate, from the string of results a combination output in accordance with a quality criterion that is to be satisfied during the interpolation;
   a filter configured to accumulate values of the combination output over a specified time interval to generate an address sequence to control the arithmetic unit to guide the string of results to satisfy the quality criterion; and
   an evaluation circuit post-connected to the filter configured to convert address values of the address sequence into output values of the interpolation.

* * * * *